(12) United States Patent
Morikazu et al.

(10) Patent No.: US 9,721,809 B2
(45) Date of Patent: Aug. 1, 2017

(54) METHOD OF FORMING GETTERING LAYER

(71) Applicant: Disco Corporation, Tokyo (JP)

(72) Inventors: Hiroshi Morikazu, Tokyo (JP); Nao Hattori, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 268 days.

(21) Appl. No.: 14/029,225

(22) Filed: Sep. 17, 2013

(65) Prior Publication Data
US 2014/0080289 A1 Mar. 20, 2014

(30) Foreign Application Priority Data

Sep. 20, 2012 (JP) ................................ 2012-206509

(51) Int. Cl.
H01L 21/268 (2006.01)
H01L 21/322 (2006.01)

(52) U.S. Cl.
CPC .......... *H01L 21/322* (2013.01); *H01L 21/268* (2013.01); *H01L 21/3221* (2013.01)

(58) Field of Classification Search
CPC ... H01L 21/3221; H01L 23/00; H01L 21/268; B23K 26/0057
USPC ............. 438/58, 473; 349/187; 257/75, 443; 437/10, 11
See application file for complete search history.

(56) References Cited

U.S. PATENT DOCUMENTS

| 4,782,029 A * | 11/1988 | Takemura ............. H01L 21/268 257/E21.239 |
| 4,994,399 A * | 2/1991 | Aoki ..................... H01L 21/268 148/DIG. 60 |
| 7,910,391 B2 * | 3/2011 | Alie ..................... B81C 1/00285 257/143 |
| 2007/0035692 A1 * | 2/2007 | Shigematsu ...... G02F 1/133351 349/187 |
| 2008/0003708 A1 * | 1/2008 | Hoshino ............ B23K 26/0057 438/33 |
| 2010/0264423 A1 * | 10/2010 | Wood .................... H01L 21/268 257/75 |
| 2011/0248372 A1 * | 10/2011 | Kurita .................. H01L 21/268 257/443 |

FOREIGN PATENT DOCUMENTS

JP 2005-317846 11/2005

* cited by examiner

*Primary Examiner* — Mohsen Ahmadi
*Assistant Examiner* — Young W Kim
(74) *Attorney, Agent, or Firm* — Greer Burns & Crain, Ltd.

(57) ABSTRACT

Disclosed herein is a method of forming a gettering layer for capturing metallic ions on the back side of a semiconductor wafer formed with devices on the face side thereof. The method includes irradiating the back-side surface of the semiconductor wafer with a pulsed laser beam having a pulse width corresponding to a thermal diffusion length of 10 to 230 nm, to thereby form the gettering layer.

12 Claims, 7 Drawing Sheets

METHOD OF FORMING GETTERING LAYER

BACKGROUND OF THE INVENTION

Field of the Invention

The present invention relates to a method of forming a gettering layer by which a gettering layer for capturing metallic ions is formed on the back side of a semiconductor wafer formed with devices on the face side thereof.

Description of the Related Art

In a semiconductor device manufacturing process, a plurality of rectangular regions are demarcated by planned dividing lines called streets arranged in a grid pattern on the face side of a semiconductor wafer having a substantially circular disk-like shape, and devices such as ICs, LSIs, etc. are formed in the rectangular regions. The semiconductor wafer thus formed with a plurality of devices is divided along the streets, to form individual semiconductor devices. In order to achieve reductions in the size and weight of the semiconductor devices, normally, the back side of the semiconductor wafer is ground to attain a predetermined wafer thickness, prior to cutting the semiconductor wafer along the streets.

When the back side of the semiconductor wafer is ground as above-mentioned, however, a grinding strain layer about 1 µm in thickness which includes microcracks would be formed on the back side of the semiconductor wafer, and die strength of the semiconductor devices would be lowered when the wafer thickness is reduced to 100 µm or below. In order to solve such a problem, it is a common practice to subject the back-side surface of the semiconductor wafer to polishing, wet etching, dry etching or the like processing, after the back side of the semiconductor wafer is ground to attain a predetermined wafer thickness. By the polishing, etching or the like processing, the grinding strain layer formed on the back side of the semiconductor wafer is removed, whereby the die strength of the semiconductor devices is prevented from being lowered.

In a semiconductor wafer formed with a plurality of semiconductor devices having a memory function such as DRAM or flash memory, however, the removal of the grinding strain layer by polishing, wet etching, dry etching or the like processing after the back-side grinding would lower the memory function. The reason for such a problem is considered as follows. The metallic ions such as copper ion contained in the inside of the semiconductor wafer, in the semiconductor device manufacturing process, are located predominantly on the back side of the semiconductor wafer, due to the gettering effect, before the removal of the grinding strain layer on the back side of the semiconductor wafer. Upon the removal of the strain layer on the back side, however, the gettering effect is lost, so that the metallic ions such as copper ion having been contained in the inside of the semiconductor wafer are floated onto the face side where the devices are formed. The floating of the metallic ions onto the face side leads to the generation of current leak.

In order to solve such a problem, Japanese Patent Laid-open No. 2005-317846 proposes a semiconductor device manufacturing method wherein a grinding strain layer (gettering layer) including microcracks which is 0.2 µm or below in thickness is formed on the back side of a semiconductor wafer, whereby semiconductor devices with a gettering effect are manufactured without lowering the die strength of the semiconductor devices.

SUMMARY OF THE INVENTION

In the semiconductor device manufacturing method described in Japanese Patent Laid-open No. 2005-317846, however, the grinding strain layer (gettering layer) including microcracks which is 0.2 µm or below in thickness is formed on the back side of the semiconductor wafer, so that there is the problem of poor reproducibility; that is, it is difficult to constantly form a good gettering layer.

Accordingly, it is an object of the present invention to provide a method of forming a gettering layer by which a gettering layer can be formed with good reproducibility, without lowering the die strength of semiconductor devices.

In accordance with an aspect of the present invention, there is provided a method of forming a gettering layer for capturing metallic ion on a back side of a semiconductor wafer formed with a plurality of devices on a face side thereof, the method including irradiating a back-side surface of the semiconductor wafer with a pulsed laser beam having a pulse width corresponding to a thermal diffusion length of 10 to 230 nm so as to form the gettering layer.

Preferably, the semiconductor wafer is a silicon wafer, and the pulse width of the pulsed laser beam is set in the range from 1 to 500 ps. In addition, the wavelength of the pulsed laser beam is preferably not more than 1,550 nm, more preferably not more than 1,064 nm. Furthermore, a relation of $v/h \leq 2d$ is established, where h (kHz) is the repetition frequency of the pulsed laser beam, v (mm/sec) is the feed rate of the pulsed laser beam, and d (µm) is the spot diameter of the pulsed laser beam.

In the method of forming a gettering layer according to one aspect of the present invention, the gettering layer is formed by irradiating the back-side surface of a semiconductor wafer with a pulsed laser beam having a pulse width corresponding to a thermal diffusion length of 10 to 230 nm. This makes it possible to form a gettering layer with good reproducibility, without lowering the die strength of semiconductor devices.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
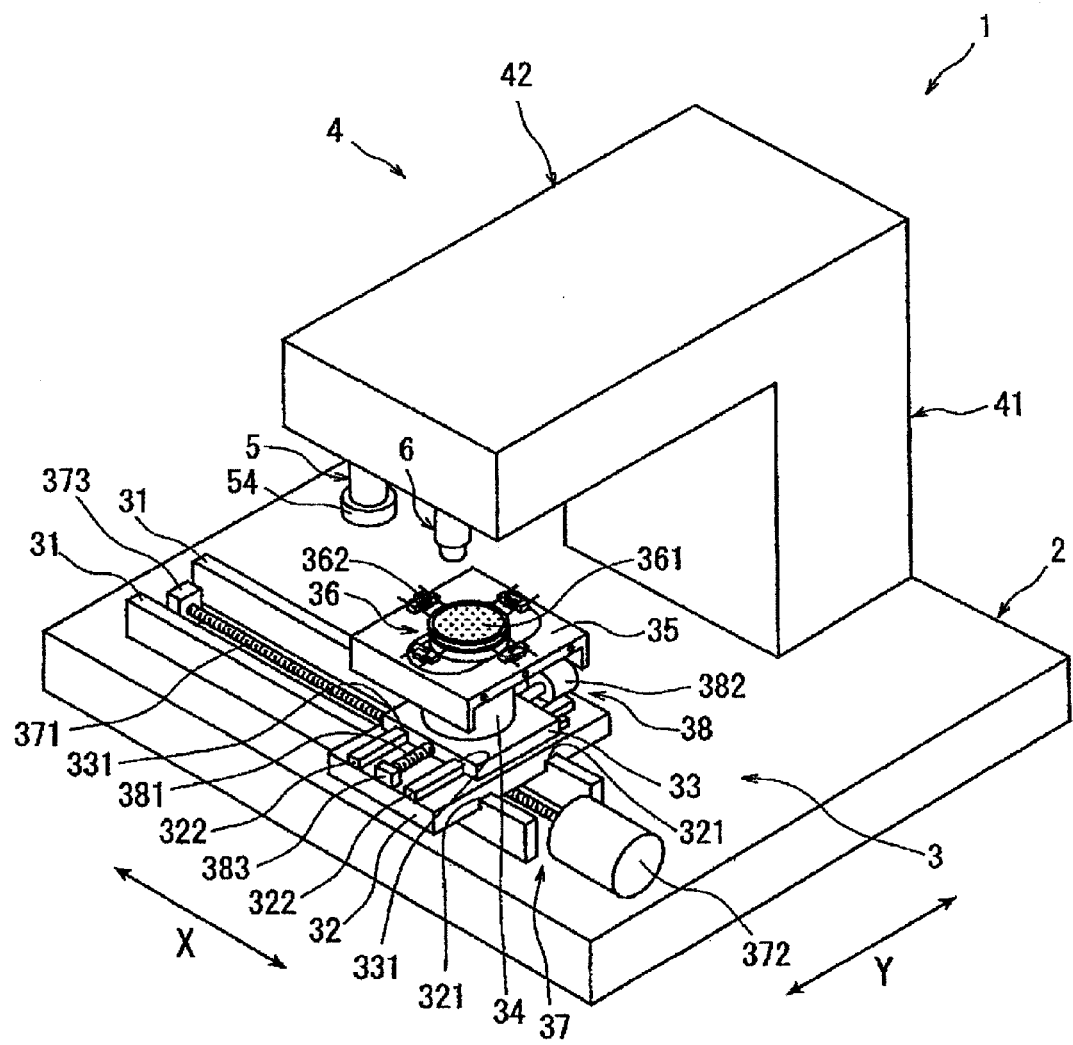
FIG. 1 is a perspective view of a laser beam processing system for carrying out the method of forming a gettering layer according to an aspect of the present invention.

Now, a preferred embodiment of the method of forming a gettering layer according to one aspect of the present invention will be described further in detail below, referring to the attached drawings. FIG. 1 shows a perspective view of a laser beam processing system for carrying out the method of forming a gettering layer according to one aspect of the present invention. The laser beam processing system 1 shown in FIG. 1 includes a stationary base 2, a chuck table mechanism 3 which is disposed on the stationary base 2 so as to be movable in a processing feed direction (X-axis direction) indicated by arrow X and which holds a work, and a laser beam irradiation unit 4 which is disposed on the stationary base 2 to function as laser beam irradiation means.

The chuck table mechanism 3 includes: a pair of guide rails 31, 31 disposed on the stationary base 2 in parallel to each other along the X-axis direction; a first slide block 32 disposed on the guide rails 31, 31 so as to be movable in the X-axis direction; a second slide block 33 disposed on the first slide block 32 so as to be movable in a Y-axis direction; a cover table 35 supported on the second slide block 33 by a hollow cylindrical member 34; and a chuck table 36 as work holding means. The chuck table 36 has a suction chuck 361 formed from a porous material. A work, for example, a semiconductor wafer having a circular disk-like shape, is held on a holding surface constituted of a top surface of the suction chuck 361, by use of suction means (not shown). The chuck table 36 configured in this fashion is rotated by a pulse motor (not shown) disposed inside the hollow cylindrical member 34. Incidentally, the chuck table 36 is equipped with clamps 362 for fixing an annular frame which supports the work, such as semiconductor wafer, through a protective tape.

The first slide block 32 is provided in its bottom surface with a pair of guided grooves 321, 321 for fitting to the above-mentioned pair of guide rails 31, 31, and is provided on its top surface with a pair of guide rails 322, 322 formed in parallel to each other along the Y-axis direction. The first slide block 32 configured in this manner can be moved in the X-axis direction along the pair of guide rails 31, 31, with its guided grooves 321, 321 fitted to the pair of guide rails 31, 31. The chuck table mechanism 3 has processing feeding means 37 for moving the first slide block 32 in the X-axis direction along the pair of guide rails 31, 31. The processing feeding means 37 includes a male screw rod 371 disposed in parallel to and between the pair of guide rails 31, 31, and a drive source such as a pulse motor 372 for rotationally driving the male screw rod 371. The male screw rod 371 has its one end rotatably supported on a bearing block 373 fixed to the stationary base 2, and has its other end connected to an output shaft of the pulse motor 372 on a power transmission basis. Incidentally, the male screw rod 371 is in screw engagement with a penetrating female screw hole formed in a female screw block (not shown) projectingly provided on the bottom surface of a central portion of the first slide block 32. Accordingly, with the male screw rod 371 driven for normal rotation and reverse rotation by the pulse motor 372, the first slide block 32 is moved in the X-axis direction along the guide rails 31, 31.

The second slide block 33 is provided in its bottom surface with a pair of guided grooves 331, 331 which are fitted to the pair of guide rails 322, 322 provided on the top surface of the first slide block 32. The second slide block 33 can be moved in the Y-axis direction, with its guided grooves 331, 331 fitted to the pair of guide rails 322, 322. The chuck table mechanism 3 has indexing feeding means 38 for moving the second slide block 33 in the Y-axis direction along the pair of guide rails 322, 322 provided on the first slide block 32. The indexing feeding means 38 includes a male screw rod 381 disposed in parallel to and between the above-mentioned pair of guide rails 322, 322, and a drive source such as a pulse motor 382 for rotationally driving the male screw rod 381. The male screw rod 381 has its one end rotatably supported on a bearing block 383 fixed to the top surface of the first slide block 32, and has its other end connected to an output shaft of the pulse motor 382 on a power transmission basis. Incidentally, the male screw rod 381 is in screw engagement with a penetrating female screw hole formed in a female screw block (not shown) projectingly provided on the bottom surface of a central portion of the second slide block 33. Accordingly, with the male screw rod 381 driven for normal rotation and reverse rotation by the pulse motor 382, the second slide block 33 is moved in the Y-axis direction along the guide rails 322, 322.

Figure 2:
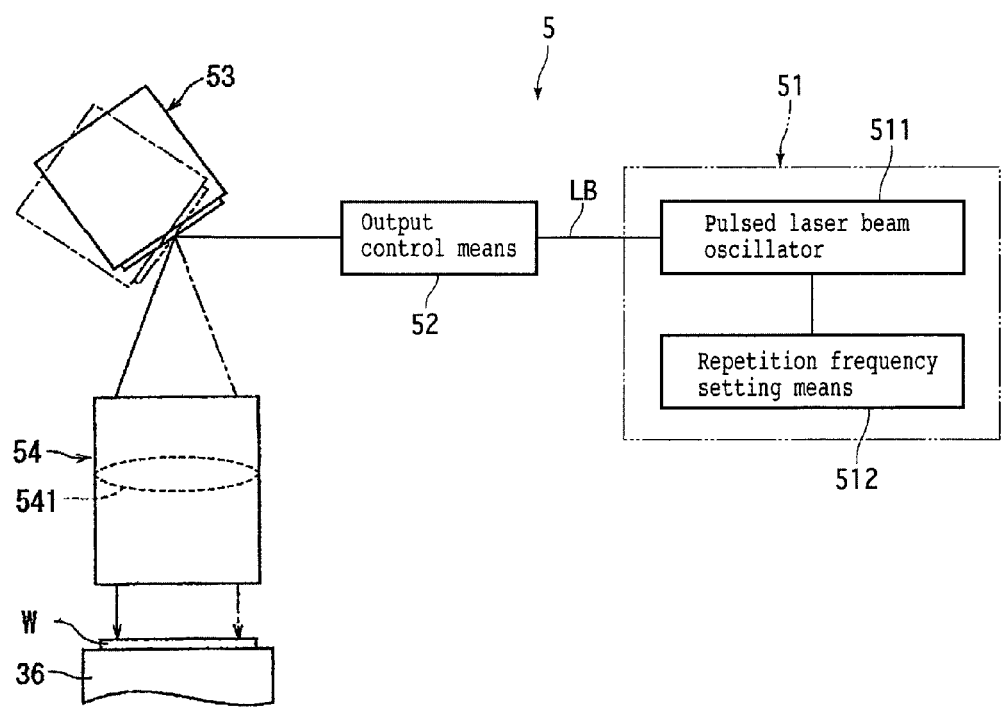
FIG. 2 is a block diagram of laser beam irradiation means incorporated in the laser beam processing system shown in FIG. 1.

The laser beam irradiation unit 4 includes: a support member 41 disposed on the stationary base 2; a casing 42 which is supported by the support member 41 and extends substantially horizontally; laser beam irradiation means 5 disposed on the casing 42; and imaging means 6 for detection of a work area to be subjected to laser beam processing. As shown in FIG. 2, the laser beam irradiation means 5 includes: pulsed laser beam oscillation means 51; output control means 52 for controlling the output of a pulsed laser beam oscillated from the pulsed laser beam oscillation means 51; a scanner 53 by which the optical axis of the pulsed laser beam controlled in output by the output control means 52 is deflected in the X-axis direction and the Y-axis direction; and a condenser 54 by which the laser beam with the optical axis deflected by the scanner 53 is condensed so as to irradiate therewith a work W held on the chuck table 36.

The pulsed laser beam oscillation means 51 is composed of a pulsed laser beam oscillator 511, and repetition frequency setting means 512 added thereto. The pulsed laser beam oscillator 511 oscillates a pulsed laser beam LB. The repetition frequency setting means 512 sets the frequency of the pulsed laser beam oscillated from the pulsed laser beam oscillator 511.

The scanner 53 is composed of a galvanometer mirror, for example, and is controlled by control means to be described later. By the scanner 53, the pulsed laser beam oscillated from the pulsed laser beam oscillator 511 is oscillated in the X-axis direction and the Y-axis direction, to be guided to the condenser 54. Incidentally, a polygon mirror or a piezo-mirror can also be used as the scanner 53.

The condenser 54 has an image-side telecentric objective lens 541 having a diameter corresponding to the diameter of the work W. By the image-side telecentric objective lens 541, the laser beam with the optical axis deflected by the scanner 53 is condensed, so as to be radiated to the work W (as a work held on the chuck table 36) in parallel to the optical axis of the image-side telecentric objective lens 541.

Returning to FIG. 1, the imaging means 6 is disposed on the casing 42 at a predetermined distance along the same straight line in the X-axis direction from the condenser 54. The imaging means 6 is composed of infrared ray irradiation means for irradiating the work with infrared rays, an optical system for capturing the infrared rays radiated from the infrared ray irradiation means, an imaging device (infrared CCD) for outputting an electrical signal corresponding to the infrared rays captured by the optical system, and the like, in addition to a normal imaging device (CCD) for imaging by use of visible rays. An image signal corresponding to the image picked up is sent from the imaging means 6 to the control means which will be described later.

Figure 3:
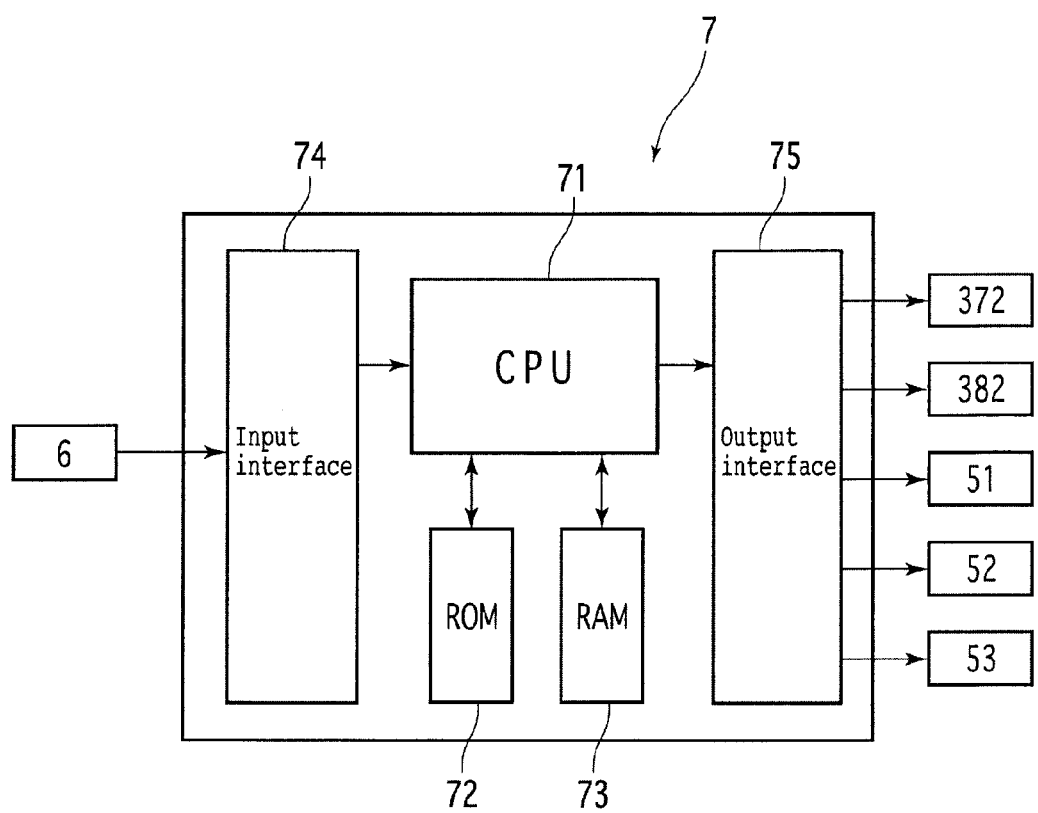
FIG. 3 is a block diagram of control means incorporated in the laser beam processing system shown in FIG. 1.
Figure 4:
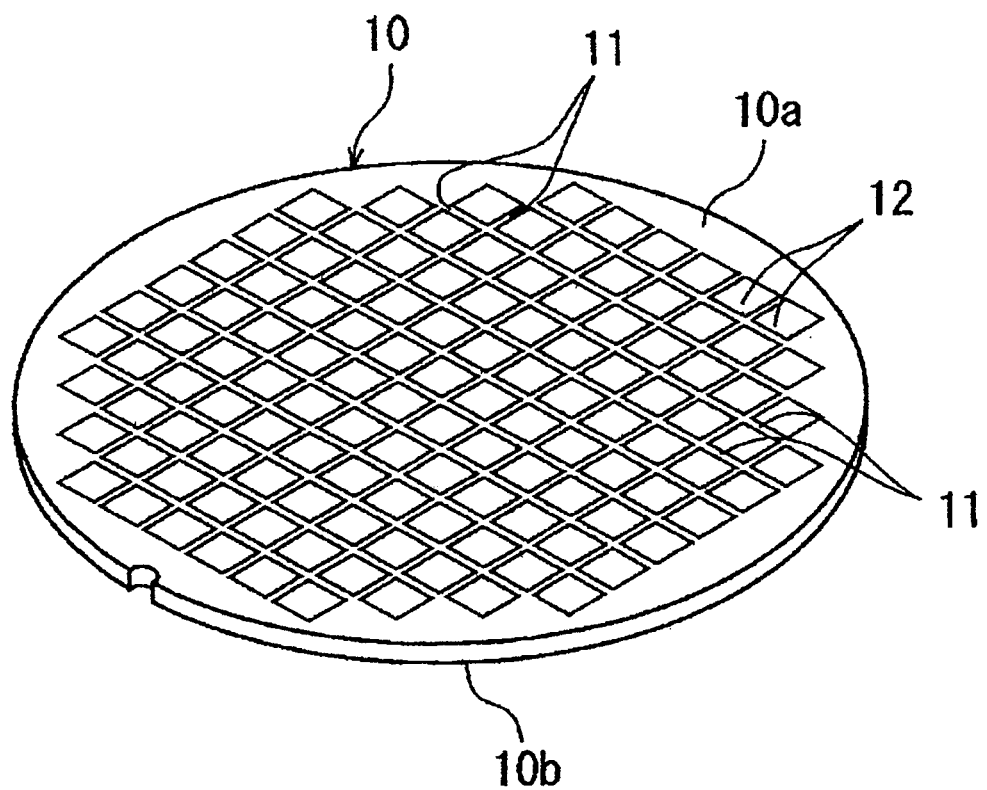
FIG. 4 is a perspective view of a semiconductor wafer as a work.

The laser beam processing system 1 has control means 7 shown in FIG. 3. The control means 7 is composed of a computer, which includes a central processing unit (CPU) 71 for executing arithmetic processings according to a control program, a read-only memory (ROM) 72 for storing the control program and the like, a random-access memory (RAM) 73 which is capable of reading and writing of information and serves for storing arithmetic operation results and the like, an input interface 74, and an output interface 75. Detection signals from the imaging means 6 and the like are inputted to the input interface 74 of the control means 7. On the other hand, control signals are outputted from the output interface 75 of the control means 7 to the pulse motor 372, the pulse motor 382, the pulsed laser beam oscillation means 51, the output control means 52, the scanner 53 and the like. Incidentally, design value data such as the diameter of the wafer 10 shown in FIG. 4 are stored in the random-access memory (RAM) 73.

Figure 5:
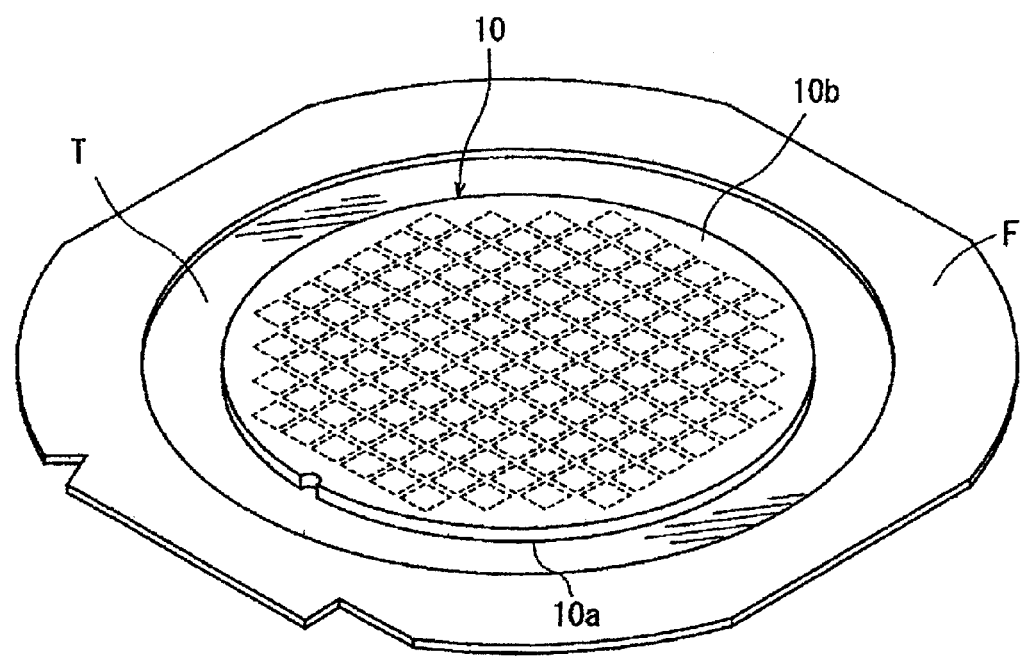
FIG. 5 is a perspective view showing a state in which the semiconductor wafer shown in FIG. 4 is adhered to a face-side surface of a protective tape attached to an annular frame.

The laser beam processing system 1 is configured as above-described. Now, the method of forming a gettering layer which is carried out by use of the laser beam processing system 1 will be described below. FIG. 4 shows a perspective view of a semiconductor wafer 10 as a wafer, or a work to be laser beam processed. The semiconductor wafer 10 shown in FIG. 4 is composed, for example, of a silicon wafer having a thickness of 100 μm, wherein devices 12 such as ICs, LSIs, etc. are formed in a plurality of regions demarcated by a plurality of streets 11 formed in a lattice pattern on a face-side surface 10a of the wafer. Of the semiconductor wafer 10 formed in this manner, the face-side surface 10a is adhered to a protective tape T composed of a sheet of a synthetic resin such as polyolefin and attached to an annular frame F, as shown in FIG. 5. Consequently, the semiconductor wafer 10 is situated with its back-side surface 10b on the upper side.

The semiconductor wafer 10 supported on the annular frame F through the protective tape T, as shown in FIG. 5, is mounted on the chuck table 36 of the laser beam processing system 1 shown in FIG. 1, with its protective tape T in contact with the chuck table 36. Then, suction means (not shown) is operated so that the semiconductor wafer 10 is suction held onto the chuck table 36 through the protective tape T therebetween (wafer-holding step). In addition, the annular frame F is fixed by the clamps 362. Consequently, the semiconductor wafer 10 suction held onto the chuck table 36 through the protective tape T therebetween is situated with its back-side surface 10b on the upper side.

Figure 6:
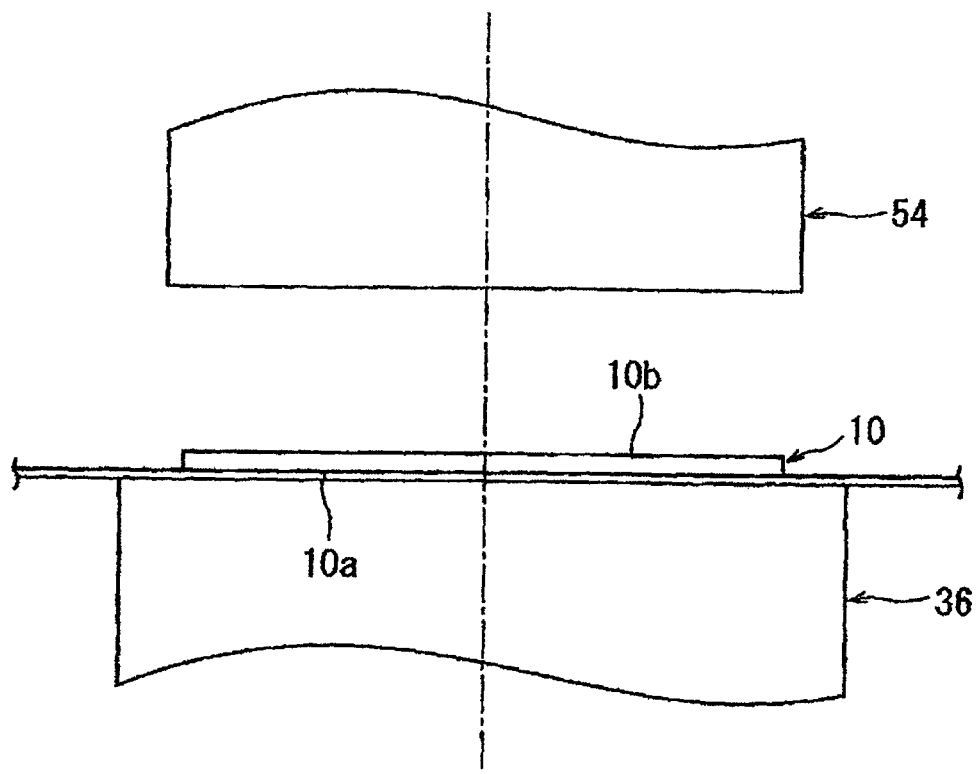
FIG. 6 illustrates a state in which a semiconductor wafer held on a chuck table of the laser beam processing system shown in FIG. 1 is positioned in a starting position for a gettering layer forming step.
Figure 7A:
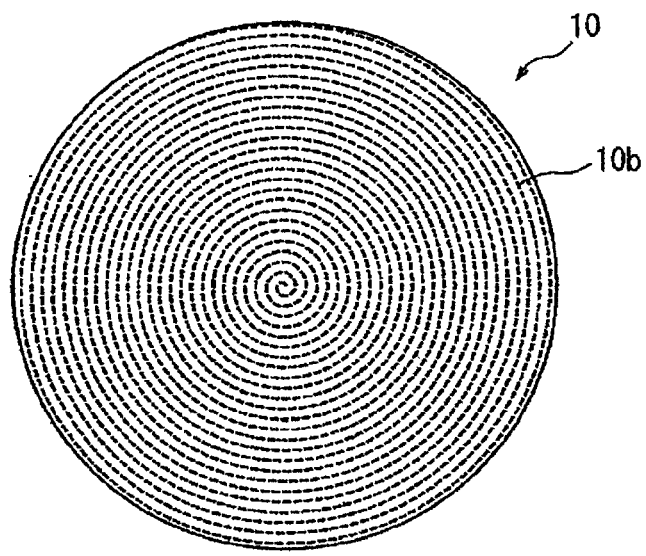
FIGS. 7A to 7C illustrate the gettering layer forming step carried out on the semiconductor wafer shown in FIG. 4 by the laser beam processing system shown in FIG. 1.
Figure 7B:
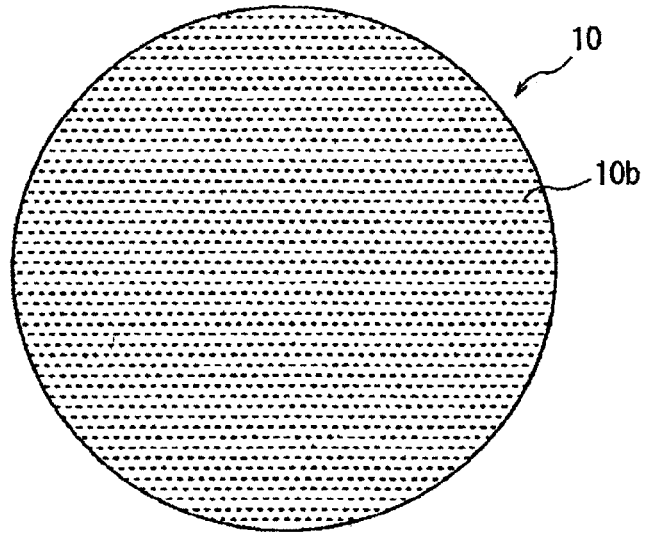
Figure 7C:
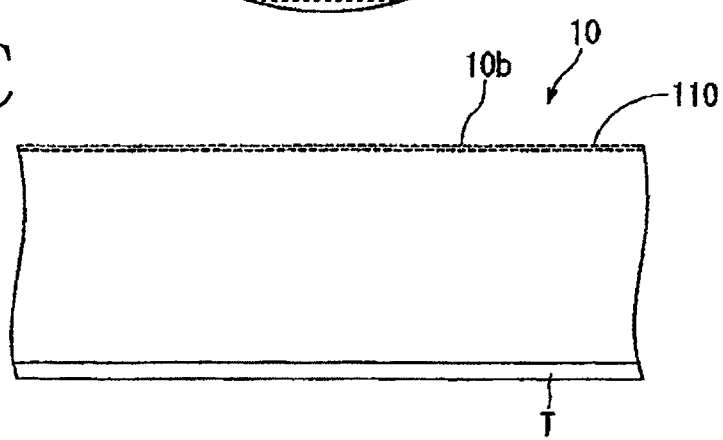

After the wafer-holding step is carried out as above-mentioned, the processing feeding means 37 and the indexing feeding means 38 are operated to move the chuck table 36 with the wafer 10 suction held thereon, whereby the center of the chuck table 36 is positioned just under the condenser 54, as shown in FIG. 6. Then, the control means 7 controls the pulsed laser beam oscillation means 51 and the output control means 52 of the laser beam irradiation means 5 and also controls the scanner 53, whereby the back-side surface 10b of the semiconductor wafer 10 is irradiated with the pulsed laser beam through the condenser 54 having the image-side telecentric objective lens 541, for example in a spiral pattern as shown in FIG. 7A or in a parallel-line pattern as shown in FIG. 7B (gettering layer forming step). In this instance, the control means 7 controls the scanner 53 on the basis of the diameter of the wafer 10 that is stored in the random-access memory (RAM) 73. As a result, a gettering layer 110 is formed at the back-side surface 10b of the semiconductor wafer 10, as shown in FIG. 7C.

Here, the pulsed laser beam with which to irradiate the back-side surface 10b of the semiconductor wafer 10 will be investigated.

EXPERIMENT 1

The relations of thermal diffusion length (the depth of the gettering layer) with die strength and gettering effect are investigated, by varying the pulse width of the pulsed laser beam.

Wavelength of pulsed laser beam: 257 nm
Repetition frequency: 200 kHz
Average output: 1 W
Spot diameter: 20 μm
Feed rate (operation speed of scanner 53): 2,000 mm/sec
Work: 15 mm-square specimen cut from 100 μm-thick silicon wafer Upon an experiment carried out under the above-mentioned conditions, the following results were obtained.

| Pulse width (ps) | Thermal diffusion length (nm) | Die strength (Mpa) | Gettering effect |
|---|---|---|---|
| 0.5 | 7.3 | 920 good | C |
| 1 | 10.3 | 920 good | A |
| 10 | 32.7 | 920 good | A |
| 50 | 73.1 | 910 good | A |
| 100 | 103.4 | 910 good | A |
| 150 | 126.7 | 910 good | A |
| 200 | 146.3 | 900 good | A |
| 250 | 163.5 | 900 good | A |
| 300 | 179.1 | 900 good | A |
| 400 | 206.8 | 890 good | A |
| 500 | 231.3 | 880 good | A |
| 600 | 253.3 | 750 bad | A |
| 700 | 273.6 | 700 bad | A |
| 800 | 292.5 | 600 bad | A |
| 900 | 310.3 | 600 bad | A |

From the results of Experiment 1 as above-mentioned, it is seen that the die strength is good when the pulse width is in the range from 0.5 to 500 picoseconds (ps), and the die strength is bad when the pulse width is not less than 600 picoseconds (ps). In addition, when the pulse width is 0.5 picosecond (ps), the gettering effect is not so good (as represented by character C), but when the pulse width is not less than 1 picosecond (ps), the gettering effect is good (as represented by character A). Therefore, it is desirable to form the gettering layer by irradiating the back-side surface of the semiconductor wafer with a pulsed laser beam having a pulse width corresponding to a thermal diffusion length of 10 to 230 nm. Particularly, in the case where the semiconductor wafer is a silicon wafer, it is desirable to set the pulse width of the pulsed laser beam to a value of 1 to 500 ps.

EXPERIMENT 2

The relations of wavelength of the pulsed laser beam with die strength and gettering effect are investigated, by varying the wavelength.

Repetition frequency: 200 kHz
Average output: 1 W
Pulse width: 100 ps
Spot diameter: 20 μm
Feed rate (operation speed of scanner 53): 2,000 mm/sec
Work: 15 mm-square specimen cut from 100 μm-thick silicon wafer Upon an experiment under the above-mentioned conditions, the following results were obtained.

| Wavelength (nm) | Die strength (Mpa) | Gettering effect |
|---|---|---|
| 172 | 900 good | A |
| 193 | 900 good | A |
| 257 | 920 good | A |
| 266 | 910 good | A |
| 343 | 930 good | A |
| 355 | 920 good | A |
| 515 | 910 good | A |
| 532 | 910 good | A |
| 630 | 910 good | A |
| 780 | 910 good | A |
| 808 | 920 good | A |
| 940 | 920 good | A |
| 1,030 | 920 good | A |
| 1,045 | 920 good | A |
| 1,064 | 920 good | A |
| 1,150 | 920 good | B |
| 1,300 | 930 good | B |
| 1,550 | 930 good | B |
| 2,000 | 930 good | C |
| 3,000 | 930 good | C |
| 5,000 | 930 good | C |

From the results of Experiment 2 as above-mentioned, it is seen that the die strength was good whenever the wavelength was not less than 172 nm. It is also seen that the gettering effect was good (as represented by character A or B) when the wavelength was in the range from 172 to 1,550 nm and the gettering effect was better (as represented by character A) when the wavelength was 172 to 1064 nm. Accordingly, the wavelength of the pulsed laser beam is preferably not more than 1,550 nm, more preferably not more than 1,064 nm.

EXPERIMENT 3

The relations of wavelength with die strength and gettering effect are investigated, by varying the feed rate (the operation speed of the scanner 53).
Wavelength of pulsed laser beam: 257 nm
Repetition frequency: 200 kHz
Average output: 1 W
Pulse width: 100 ps
Spot diameter: 20 μm
Work: 15 mm-square specimen cut from 100 μm-thick silicon wafer Upon an experiment under the above-mentioned conditions, the following results were obtained.

| Feed rate (mm/sec) | Die strength (Mpa) | Gettering effect |
|---|---|---|
| 10 | 550 bad | A |
| 50 | 600 bad | A |
| 100 | 720 bad | A |
| 500 | 750 bad | A |
| 1,000 | 890 good | A |
| 1,500 | 980 good | A |
| 2,000 | 900 good | A |
| 2,500 | 990 good | A |
| 3,000 | 910 good | A |
| 3,500 | 910 good | A |
| 4,000 | 910 good | A |
| 4,500 | 910 good | A |
| 5,000 | 920 good | A |
| 5,500 | 920 good | A |
| 6,000 | 920 good | A |
| 7,000 | 920 good | A |
| 8,000 | 920 good | A |
| 9,000 | 920 good | C |
| 10,000 | 920 good | C |
| 15,000 | 910 good | C |

Under the above-mentioned experimental conditions, the die strength was good when the feed rate was not less than 1,000 mm/sec, but the gettering effect was bad (as represented by character C) when the feed rate was not less than 9,000 mm/sec. Therefore, the feed rate is desirably in the range from 1,000 to 8,000 mm/sec. Incidentally, under the above-mentioned experimental conditions, the spot interval of the pulsed laser beam is ¼ times the spot diameter when the feed rate is 1,000 mm/sec, and the spot interval of the pulsed laser beam is 2 times the spot diameter when the feed rate is 8,000 mm/sec.

In order to fulfill these conditions, a relation represented by the inequality $v/h \leq 2d$ should be established, where h (kHz) is the repetition frequency of the pulsed laser beam, v (mm/sec) is the feed rate of the pulsed laser beam, and d (μm) is the spot diameter of the pulsed laser beam.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of forming a gettering layer configured to capture metallic ions on a back-side surface of a semiconductor wafer formed with a plurality of devices on a face-side surface thereof, the method comprising:
   irradiating the back-side surface of the semiconductor wafer with a pulsed laser beam to form the gettering layer of a depth of 10 to 230 nm, wherein the gettering layer is formed from the same material as the remainder of the semiconductor wafer, wherein the semiconductor wafer is a silicon wafer, and a pulse width of the pulsed laser beam is set in the range from 1 to 500 ps, and
   wherein a relation of $v/h \leq 2d$ is established, where h (kHz) is the repetition frequency of the pulsed laser beam, v (mm/sec) is the feed rate of the pulsed laser beam, and d (micron) is the spot diameter of the pulsed laser beam.

2. The method of forming a gettering layer according to claim 1, wherein the wavelength of the pulsed laser beam is set to be not more than 1,550 nm.

3. The method of forming a gettering layer according to claim 2, wherein the wavelength of the pulsed laser beam is set to be not more than 1,064 nm.

4. The method of forming a gettering layer according to claim 1, wherein the entire back-side surface of the semiconductor wafer is irradiated with the pulsed laser beam.

5. The method of claim 4, wherein the irradiating is performed in a spiral pattern.

6. The method of claim 4, wherein the irradiating is performed in a parallel line pattern.

7. The method of claim 1, wherein the pulsed laser beam is passed through a condenser prior to irradiating the back-side surface of the semi-conductor wafer.

8. The method of claim 7, wherein the condenser includes an objective lens.

9. The method of claim 8, wherein said objective lens has a diameter that is approximately equal to the diameter of the semiconductor wafer.

10. The method of claim 7, wherein the back-side surface of said semiconductor wafer is composed of silicon, and further wherein the back-side surface of said semiconductor wafer directly faces said condenser.

11. The method of claim 1, wherein the feed rate is at least 1000 mm/sec.

12. The method of claim 1, wherein the wavelength of the pulsed laser beam is set between about 515 nm and about 1,064 nm.

* * * * *